US006963104B2

(12) United States Patent
Wu et al.

(10) Patent No.: US 6,963,104 B2
(45) Date of Patent: Nov. 8, 2005

(54) NON-VOLATILE MEMORY DEVICE

(75) Inventors: Yider Wu, Campbell, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/459,576

(22) Filed: Jun. 12, 2003

(65) Prior Publication Data

US 2004/0251487 A1 Dec. 16, 2004

(51) Int. Cl.[7] .............................................. H01L 29/788

(52) U.S. Cl. ...................... 257/315; 257/322; 257/324; 257/325; 438/211; 438/593

(58) Field of Search ................................ 257/315, 270, 257/322, 324, 325; 438/257, 689, 690, 201, 438/211, 216, 261, 591, 593

(56) References Cited

U.S. PATENT DOCUMENTS

| | | | | |
|---|---|---|---|---|
| 5,379,255 | A | 1/1995 | Shah | 365/185 |
| 5,382,540 | A | 1/1995 | Sharma et al. | 437/52 |
| 5,959,328 | A | 9/1999 | Krautschneider et al. | 257/314 |
| 5,973,356 | A | 10/1999 | Noble et al. | 257/319 |
| 6,207,515 | B1 | 3/2001 | Hsieh et al. | 438/300 |
| 6,440,801 | B1 | 8/2002 | Furukawa et al. | 438/272 |
| 6,551,880 | B1 | 4/2003 | Lai et al. | 438/261 |
| 6,580,124 | B1 | 6/2003 | Cleeves et al. | 257/331 |
| 6,727,544 | B2 | 4/2004 | Endoh et al. | 257/315 |
| 6,768,158 | B2 * | 7/2004 | Lee et al. | 257/315 |
| 6,768,166 | B2 | 7/2004 | Hagemeyer | 257/324 |
| 2002/0028541 | A1 | 3/2002 | Lee et al. | 438/149 |
| 2003/0042531 | A1 * | 3/2003 | Lee et al. | 257/315 |
| 2003/0235075 | A1 | 12/2003 | Forbes | 365/177 |
| 2004/0235300 | A1 * | 11/2004 | Mathew et al. | 438/689 |

FOREIGN PATENT DOCUMENTS

DE 102 20 923 A1 11/2003

OTHER PUBLICATIONS

Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

Copy of co-pending U.S. Appl. No. 10/726,508; by Wiley Eugene Hill et al., filed Dec. 4, 2003 entitled: "Flash Memory Device," 17 page specification, 10 sheets of drawings.

* cited by examiner

*Primary Examiner*—David Nelms
*Assistant Examiner*—Long Tran
(74) *Attorney, Agent, or Firm*—Harrity & Snyder, LLP

(57) ABSTRACT

A non-volatile memory device includes a substrate, an insulating layer, a fin, a number of dielectric layers and a control gate. The insulating layer is formed on the substrate and the fin is formed on the insulating layer. The dielectric layers are formed over the fin and the control gate is formed over the dielectric layers. The dielectric layers may include oxide-nitride-oxide layers that function as a charge storage structure for the memory device.

15 Claims, 11 Drawing Sheets

100

100

100

100

600

800

800

800

1000

NON-VOLATILE MEMORY DEVICE

TECHNICAL FIELD

The present invention relates to memory devices and methods of manufacturing memory devices. The present invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement, e.g., a ten year data retention requirement.

DISCLOSURE OF THE INVENTION

Implementations consistent with the present invention provide a non-volatile memory device formed using a fin structure. Oxide-nitride-oxide (ONO) layers may be formed over the fin structure and a polysilicon layer may be formed over the ONO layers. The nitride layer in the ONO layers may function as the floating gate electrode for the non-volatile memory device. The polysilicon layer may function as the control gate and may be separated from the floating gate by the top oxide layer of the ONO layers.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a memory device that includes a substrate, an insulating layer, a fin structure, a number of dielectric layers and a control gate. The insulating layer is formed on the substrate and the fin structure is formed on the insulating layer. The dielectric layers are formed over the fin structure and function as a charge storage dielectric and the control gate is formed over the dielectric layers.

According to another aspect of the invention, a method of manufacturing a non-volatile memory device is provided. The method includes forming a fin on an insulating layer, where the fin acts as a substrate and a bitline for the non-volatile memory device. The method also includes forming a number of dielectric layers over the fin, where the dielectric layers function as a charge storage dielectric. The method further includes forming source and drain regions, depositing a gate material over the dielectric layers and patterning and etching the gate material to form a control gate.

According to another aspect of the invention, a non-volatile memory array that includes a substrate, an insulating layer, a number of conductive fins, a number of dielectric layers and a number of gates is provided. The insulating layer is formed on the substrate and the conductive fins are formed on the insulating layer. The conductive fins act as bit lines for the memory array. The dielectric layers are formed over the fins and the gates are formed over the dielectric layers. The gates act as word lines for the memory array.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide non-volatile memory devices, such as electrically erasable programmable read only memory (EEPROM) devices, and methods of manufacturing such devices. The memory device may include a fin field effect transistor (FinFET) structure with dielectric layers and a control gate layer formed over a fin. One or more of the dielectric layers may act as a floating gate for the memory device.

Figure 1:
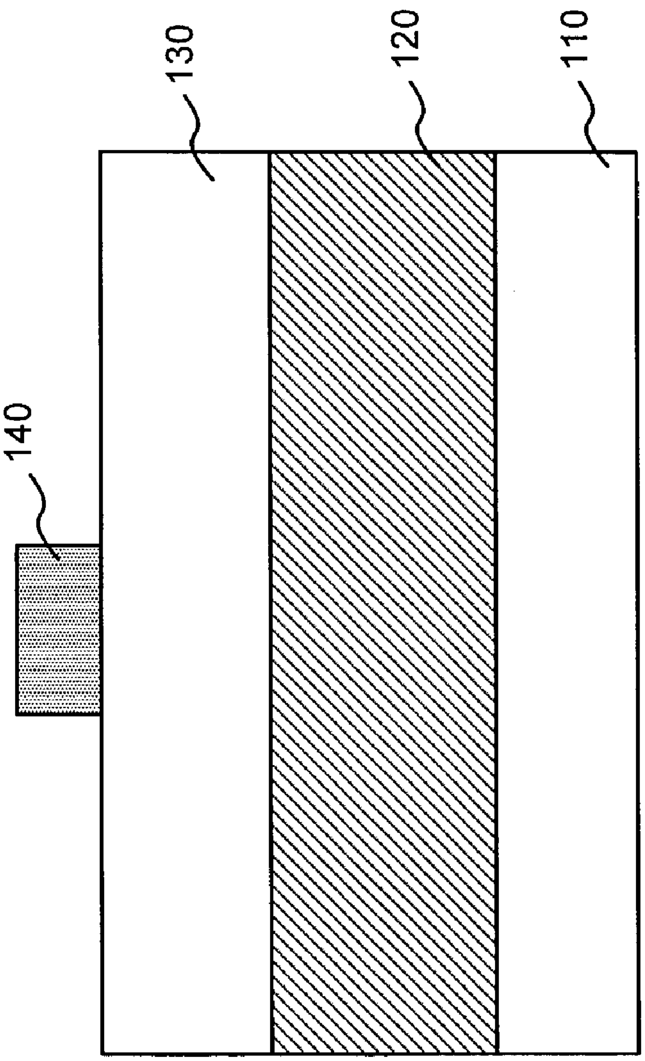
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

In an exemplary implementation, buried oxide layer 120 may include a silicon oxide, such as $SiO_2$, and may have a thickness ranging from about 50 Å to about 1000 Å. Silicon layer 130 may include monocrystalline or polycrystalline silicon having a thickness ranging from about 200 Å to about 3000 Å. Silicon layer 130 may be used to form a fin structure, as described in more detail below.

In alternative implementations consistent with the present invention, substrate 110 and layer 130 may comprise other semiconducting materials, such as germanium, or combinations of semiconducting materials, such as silicon-germanium. Buried oxide layer 120 may also include other dielectric materials.

Optionally, a dielectric layer, such as a silicon nitride layer or a silicon oxide layer (not shown), may be formed over silicon layer 130 to act as a protective cap during subsequent etching processes.

A photoresist material may be deposited and patterned to form a photoresist mask 140 for subsequent processing, as illustrated in FIG. 1. The photoresist material may be deposited and patterned in any conventional manner.

Figure 2A:
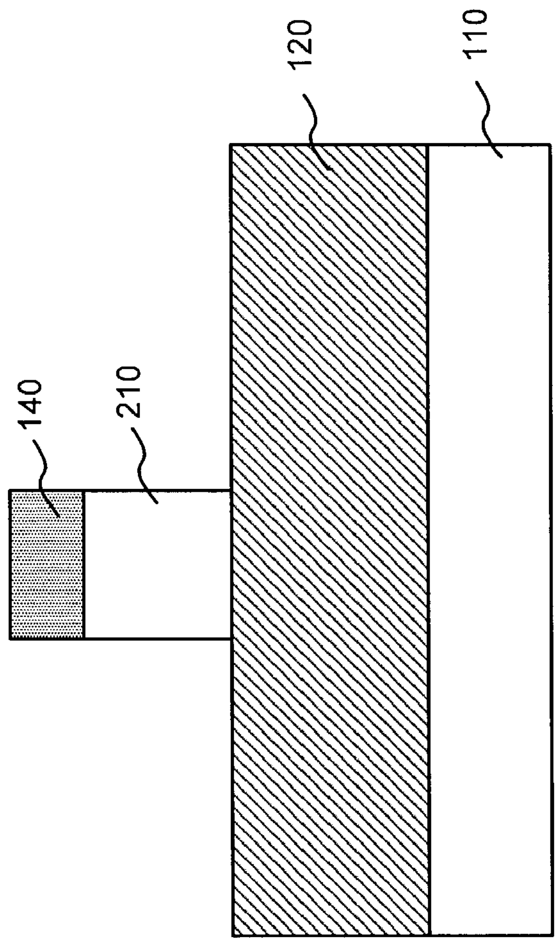
FIG. 2A is a cross-section illustrating the formation of a fin in accordance with an exemplary embodiment of the present invention.

Semiconductor device 100 may then be etched. In an exemplary implementation, silicon layer 130 may be etched in a conventional manner, with the etching terminating on buried oxide layer 120, as illustrated in FIG. 2A. Referring to FIG. 2A, the portion of silicon layer 130 located under photoresist mask 140 has not been etched, thereby forming a fin 210 comprising silicon. In an exemplary implementation, the width of fin 210 ranges from about 100 Å to about 3000 Å. Fin 210 may function as a substrate and bitline for semiconductor device 100, as described in more detail below.

Figure 2B:
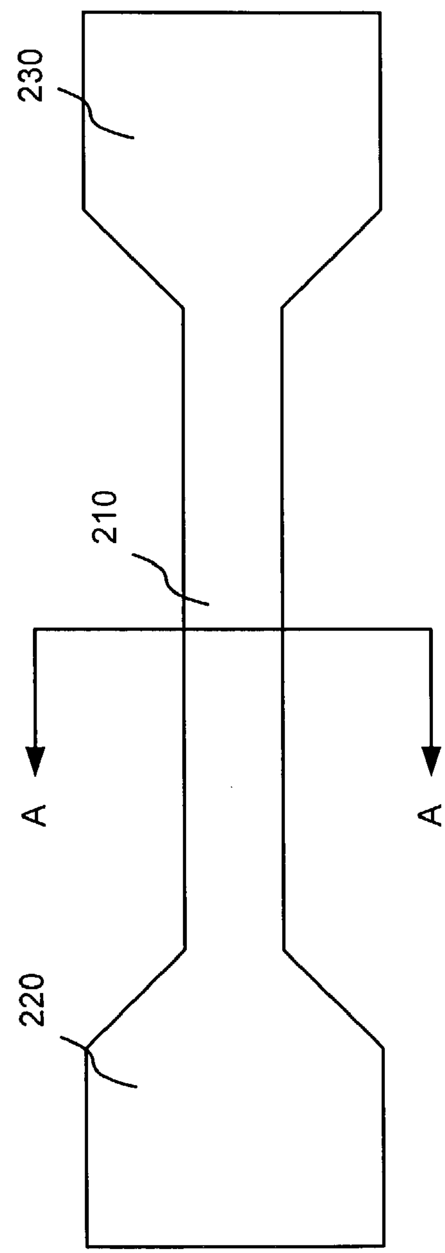
FIG. 2B is a top view illustrating the fin of FIG. 2A along with source and drain regions formed adjacent the fin in accordance with an exemplary embodiment of the present invention.

During the formation of fin 210, bitline pickup or source and drain regions may also be formed adjacent the respective ends of fin 210. For example, silicon layer 130 may be patterned and etched to form bitline pickup or source and drain regions. FIG. 2B illustrates a top view of semiconductor 100 including source region 220 and drain region 230 formed adjacent fin 210 on buried oxide layer 120, according to an exemplary embodiment of the present invention. The buried oxide layer and the photoresist mask are not illustrated in FIG. 2B for simplicity.

Figure 3:
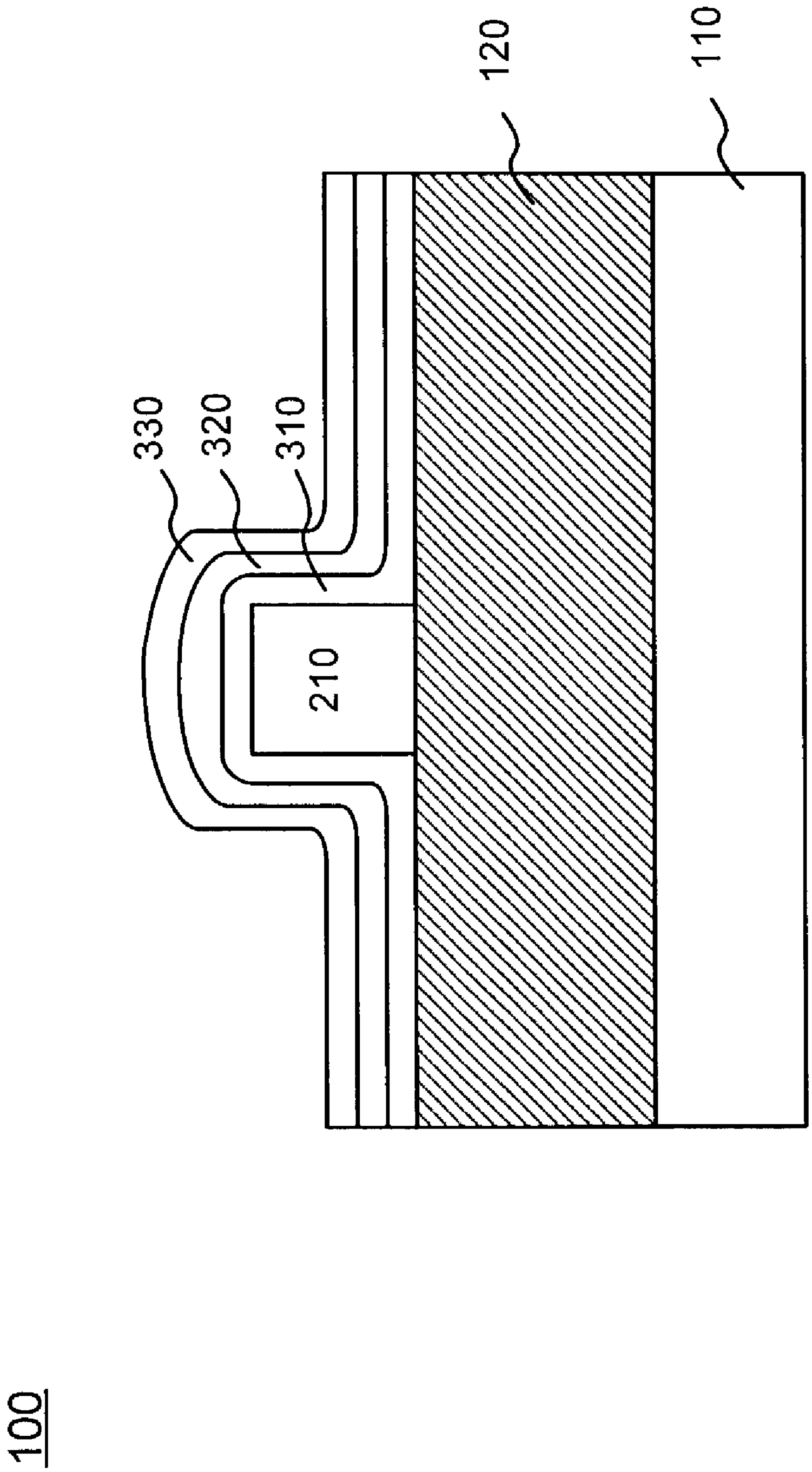
FIG. 3 is a cross-section illustrating the formation of dielectric layers on the fin of FIG. 2A in accordance with an exemplary embodiment of the present invention.

Photoresist mask 140 may then be removed. A number of films may then be deposited over fin 210. In an exemplary implementation, an oxide-nitride-oxide (ONO) film may be formed over fin 210. For example, an oxide layer 310 may be formed over fin 210, as illustrated in FIG. 3. The cross-section illustrated in FIG. 3 is taken along line AA in FIG. 2B. In an exemplary implementation, oxide layer 310 may be deposited or thermally grown to a thickness ranging from about 15 Å to about 150 Å. Next, a nitride layer 320 may be formed over oxide layer 310, as illustrated in FIG. 3. In an exemplary implementation, nitride layer 320 may be deposited to a thickness ranging from about 10 Å to about 180 Å. Another oxide layer 330 may then be formed over nitride layer 320, as illustrated in FIG. 3. In an exemplary implementation, oxide layer 330 may be deposited or thermally grown to a thickness ranging from about 15 Å to about 200 Å. Layers 310–330 form an ONO charge storage dielectric for the subsequently formed memory device. More particularly, the nitride layer 320 may act as the floating gate electrode for the memory device.

Figure 4:
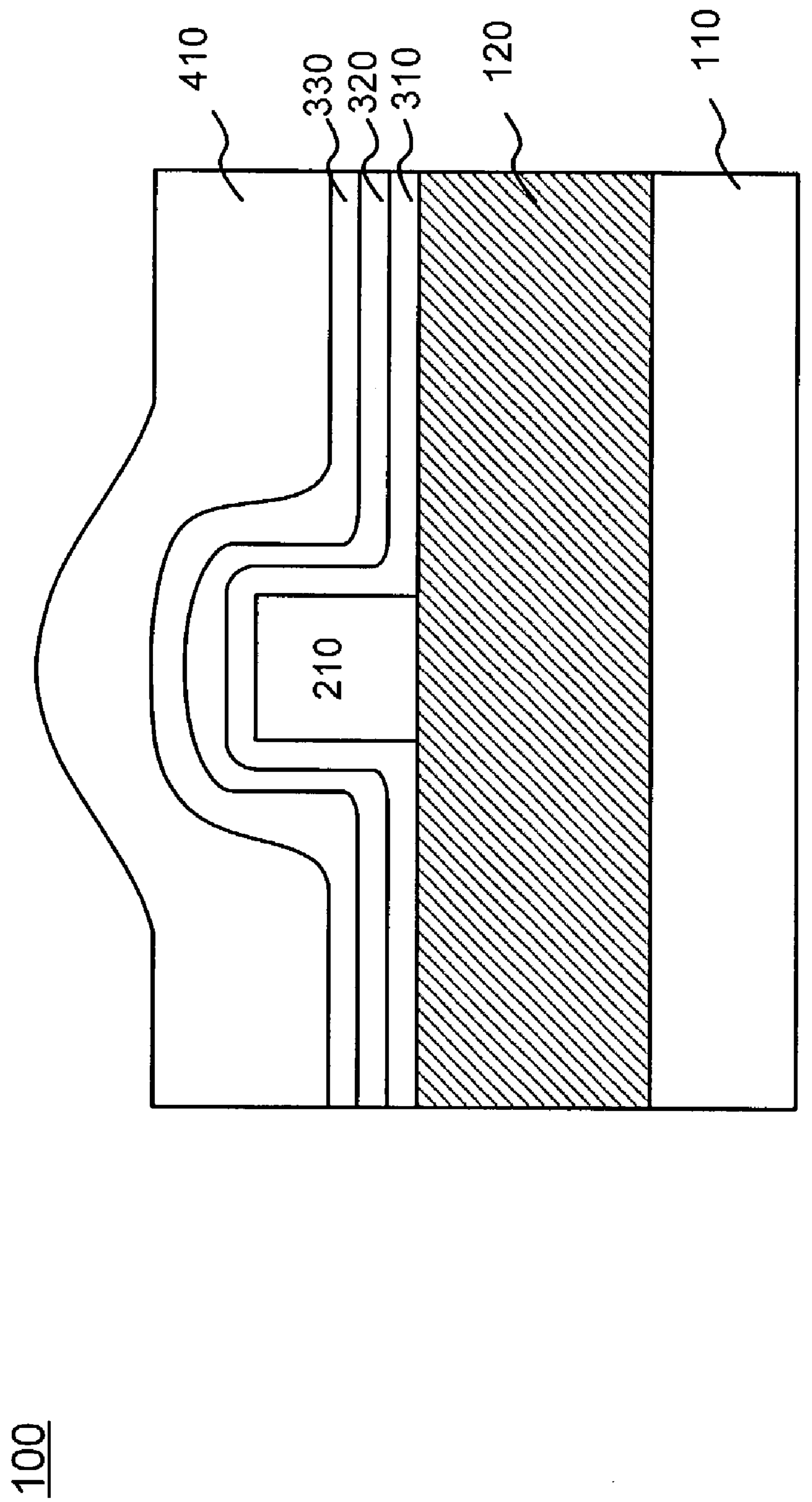
FIG. 4 is a cross-section illustrating the formation of control gate material on the device of FIG. 3 in accordance with an exemplary embodiment of the present invention.

A silicon layer 410 may then be formed over semiconductor 100 in a conventional manner, as illustrated in FIG. 4. The silicon layer 410 may be used as gate material for a subsequently formed control gate electrode. In an exemplary implementation, the silicon layer 410 may comprise polysilicon deposited using conventional chemical vapor deposition (CVD) to a thickness ranging from about 300 Å to about 4000 Å. Alternatively, other semiconducting materials, such as germanium or combinations of silicon and germanium, or various metals may be used as the gate material.

Figure 5:
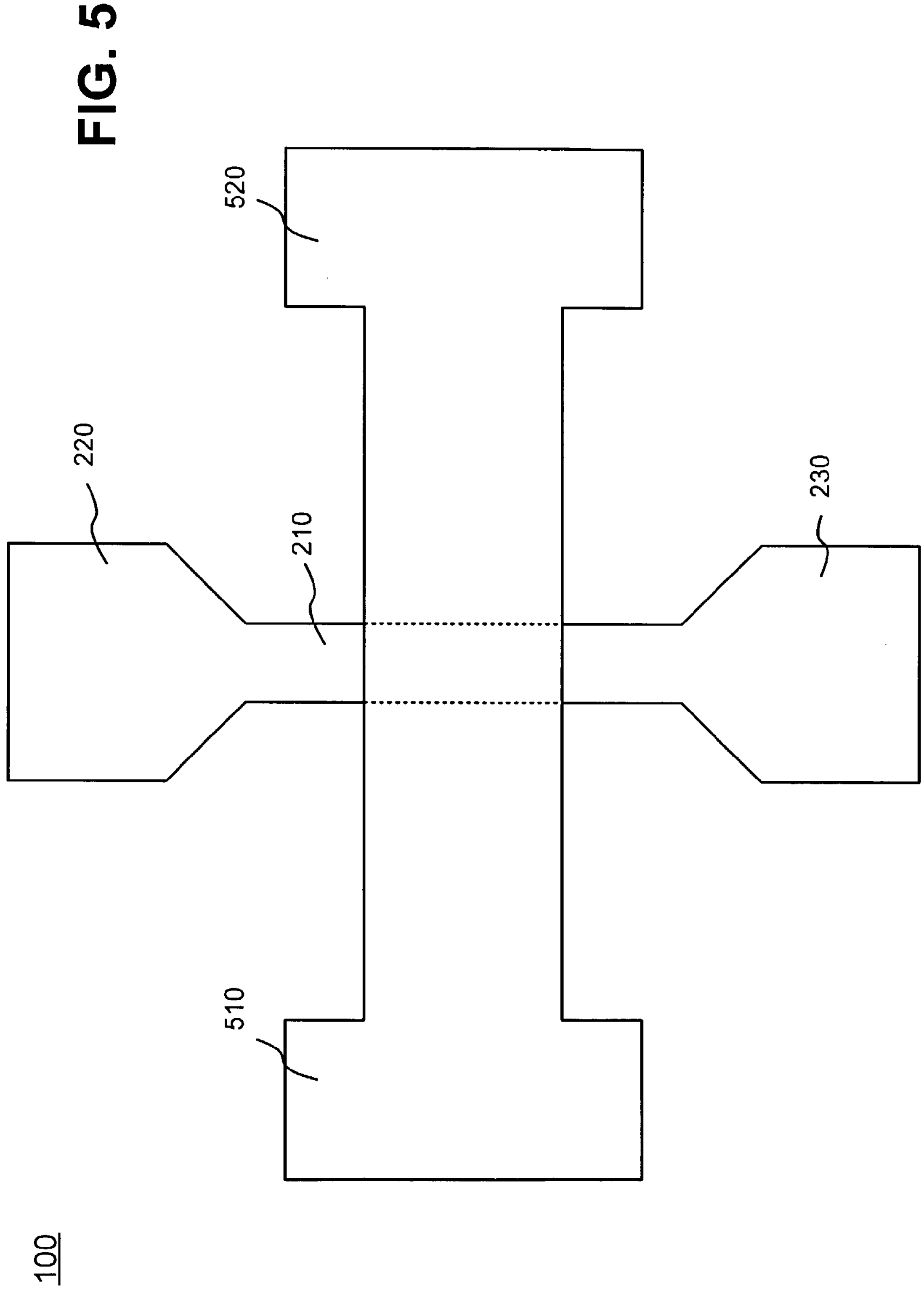
FIG. 5 is a top view illustrating an exemplary non-volatile memory device formed in accordance with an exemplary embodiment of the present invention.

Silicon layer 410 may then be patterned and etched to form the control gate for semiconductor device 100. For example, FIG. 5 illustrates a top view of semiconductor device 100 consistent with the present invention after the control gate electrode(s) are formed. Referring to FIG. 5, silicon layer 410 has been patterned and etched to form control gate electrodes 510 and 520 located on either side of fin 210. The ONO layers 310–330 are not shown in FIG. 5, but are located between control gate electrodes 510 and 520 and fin 210.

The source/drain regions 220 and 230 may then be doped. For example, n-type or p-type impurities may be implanted in source/drain regions 220 and 230. For example, an n-type dopant, such as phosphorous, may be implanted at a dosage of about $1\times10^{14}$ atoms/$cm^2$ to about $5\times10^{15}$ atoms/$cm^2$ and an implantation energy of about 0.5 KeV to about 100 KeV. Alternatively, a p-type dopant, such as boron, may be implanted at similar dosages and implantation energies. The particular implantation dosages and energies may be selected based on the particular end device requirements. One or ordinary skill in this art would be able to optimize the source/drain implantation process based on the circuit requirements. In alternative implementations, source/drain regions 220 and 230 may be doped at an earlier step in the formation of semiconductor device 100, such as prior to formation of ONO layers 310–330. In addition, sidewall spacers may optionally be formed prior to the source/drain ion implantation to control the location of the source/drain junctions based on the particular circuit requirements. Activation annealing may then be performed to activate the source/drain regions 220 and 230.

The resulting semiconductor device 100 illustrated in FIG. 5 has a silicon-oxide-nitride-oxide-silicon (SONOS) structure. That is, semiconductor device 100 may include a silicon fin 210 with ONO dielectric layers 310–330 and silicon control gates 510/520 formed thereon. Fin 210 functions as a substrate electrode for the memory device and ONO layers 310–330 may function as a charge storage structure.

Semiconductor device 100 can operate as a non-volatile memory device, such as an EEPROM. Programming may be accomplished by applying a bias of, for example, about 3 to 20 volts to control gate 510 or 520. For example, if the bias is applied to control gate 510, electrons may tunnel from fin substrate 210 into ONO layers 310–330 (i.e., the charge storage electrode). A similar process may occur if the bias is applied to control gate 520. Erasing may be accomplished by applying a bias of, for example, about −3 to −20 volts to control gate 510/520.

Thus, in accordance with the present invention, a non-volatile memory device is formed using a FinFET structure. Advantageously, semiconductor device 100 has a double-gate structure with control gates 510 and 520 formed on either side of fin 210. Each of control gates 510 and 520 may be used to program the memory device. In addition, the FinFET structure enables the resulting memory device 100 to achieve increased circuit density as compared to conventional memory devices. The present invention can also be easily integrated into conventional semiconductor fabrication processing.

Figure 6:
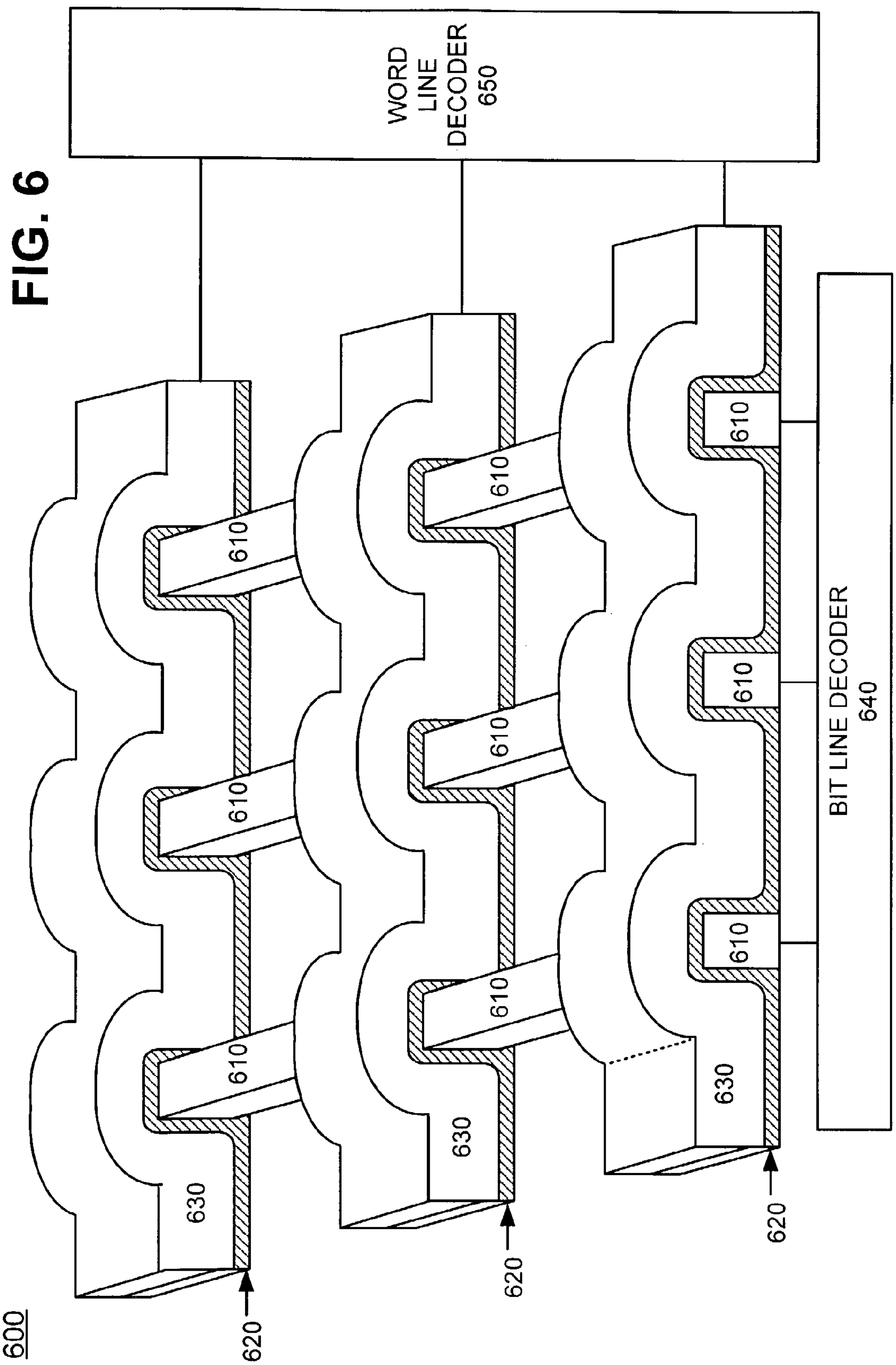
FIG. 6 is a perspective view illustrating an exemplary non-volatile memory array formed in accordance with an exemplary embodiment of the present invention.

The structure of semiconductor device 100 illustrated in FIG. 5 may be used to form a SONOS-type non-volatile memory array. For example, semiconductor device 100 in FIG. 5 includes a memory cell that may used to store a single bit of information. According to an exemplary implementation, a number of memory cells similar to that illustrated in FIG. 5 may be used to form a memory array. For example, FIG. 6 illustrates an exemplary memory array 600 formed in accordance with an embodiment of the present invention. Referring to FIG. 6, memory array 600 includes a number of silicon fins 610 separated by a predetermined distance. Silicon fins 610 may be formed in a manner similar to that discussed above with respect to fin 210. Each of fins 610 may represent a bit line and the fins 610 may be separated by a predetermined distance in the lateral direction, such as 500 Å.

An ONO film 620 may then be formed over fins 610 in a manner similar to that described above with respect to ONO layers 310–330 in FIG. 3. The ONO film 620 may be formed over predetermined portions of fins 610, as illustrated in FIG. 6. A silicon layer may then be deposited, patterned and etched in a similar manner as silicon layer 410 (FIG. 4) to form a control gate 630 over ONO layers 620, as illustrated in FIG. 6. Control gate 630 may be formed over each of ONO layers 620, as illustrated in FIG. 6, and each of control gates 630 may represent a word line of memory array 600.

A bit line decoder 640 and word line decoder 650 may then be coupled to the bit lines 610 and word lines 630, respectively. The bit line and word line decoders 640 and 650 may then be used to facilitate programming or reading out data stored in each particular cell of the memory array 600. In this manner, a high density non-volatile memory array may be formed using a FinFET structure.

OTHER EMBODIMENTS

Figure 7A:
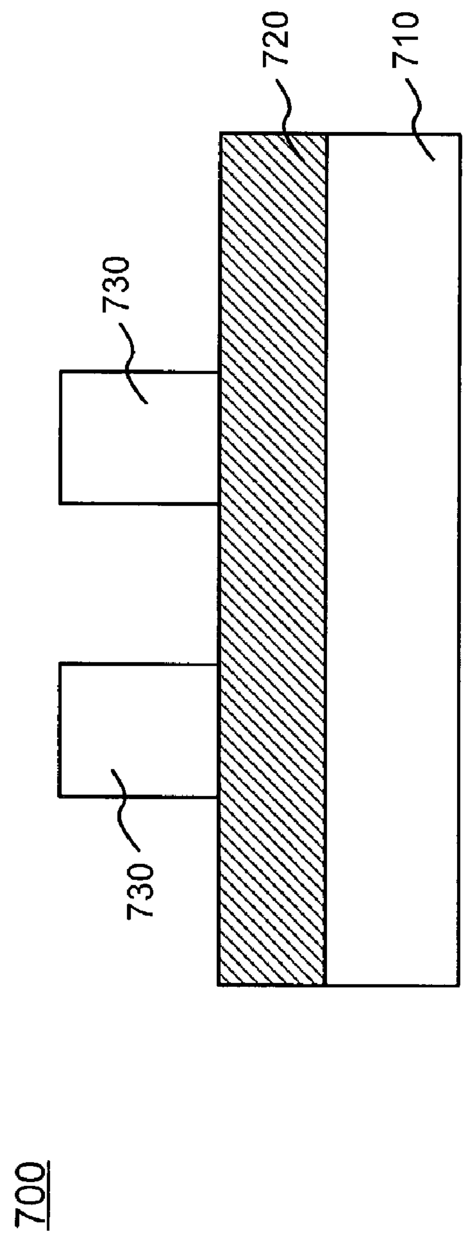
FIGS. 7A and 7B are cross-sections illustrating the formation of a semiconductor device with multiple fins in accordance with another embodiment of the present invention.

In other embodiments of the present invention, a memory device with multiple fins may be formed, as illustrated in FIG. 7A. Referring to FIG. 7A, semiconductor device 700 may include a silicon on insulator structure with a buried oxide layer 710 formed on a substrate (not shown) and silicon fins 730 formed on buried oxide layer 710. Silicon fins 730 may be formed by selectively etching a silicon layer in a similar manner as fin 210 described above with respect to FIGS. 1 and 2A.

Figure 7B:
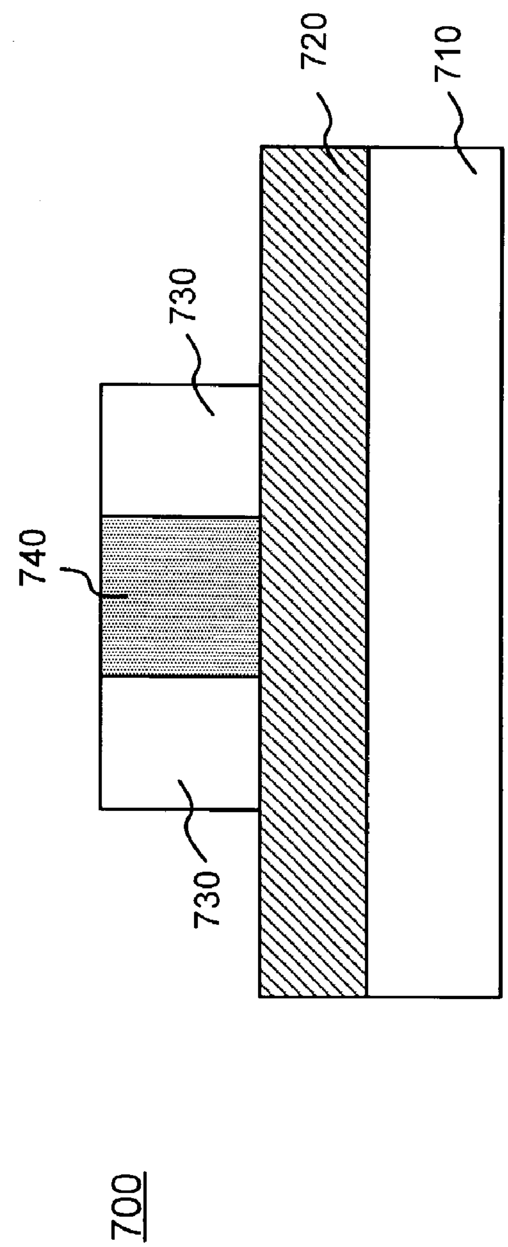

Next a low-K material 740, such as a fluorinated oxide, may be deposited to fill the space between the silicon fins 730, as illustrated in FIG. 7B. Alternatively, other low-K materials may be used. The low-K material 730 may be planarized with the upper surface of fins 730, as illustrated in FIG. 7B. Advantageously, the low-k material 730 reduces capacitive coupling and effectively isolates the fins 730 from each other.

Figure 8A:
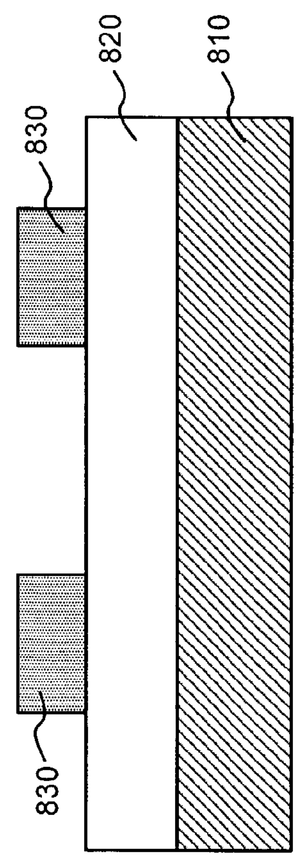
FIGS. 8A–8C are cross-sections illustrating the formation of a semiconductor device with multiple fins having a small pitch in accordance with another embodiment of the present invention.
Figure 8B:
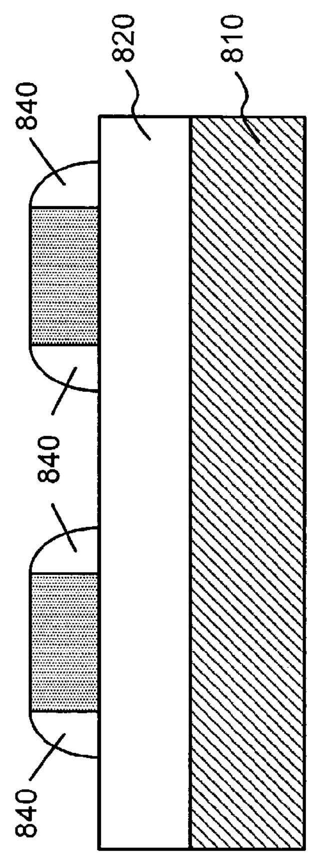
Figure 8C:
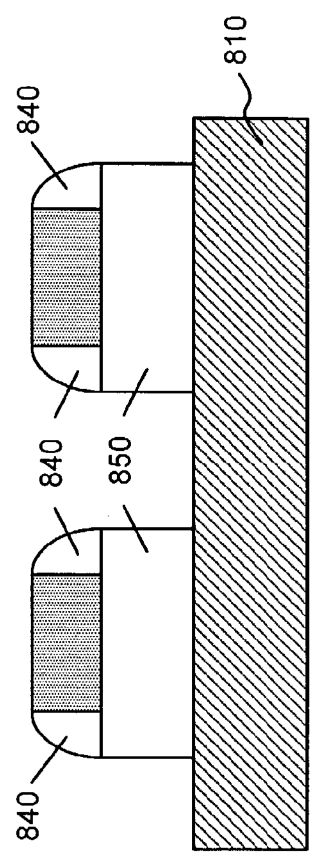

In another embodiment, a FinFET memory device having fins with a small pitch may be formed from a silicon on insulator structure. For example, referring to FIG. 8, semiconductor device 800 may include an oxide layer 810 formed on a substrate (not shown) with a silicon layer 820 formed thereon. A material such as a silicon nitride or a silicon oxide may be deposited and patterned to form hard masks 830, as illustrated in FIG. 8A. Next, a spacer material, such as SiN, SiO, or some other material may be deposited and etched to form spacers 840 on the side surfaces of hard masks 830, as illustrated in FIG. 8B. Silicon layer 820 may then be etched using structures 830 and 840 as masks to form silicon fins 850, as illustrated in FIG. 8C. Silicon fins 850 may be used as bit lines for a memory array. Advantageously, silicon fins 850 may be formed with a small space between the fins 850. The spacers 840 and hard masks 830 may then be removed.

Figure 9A:
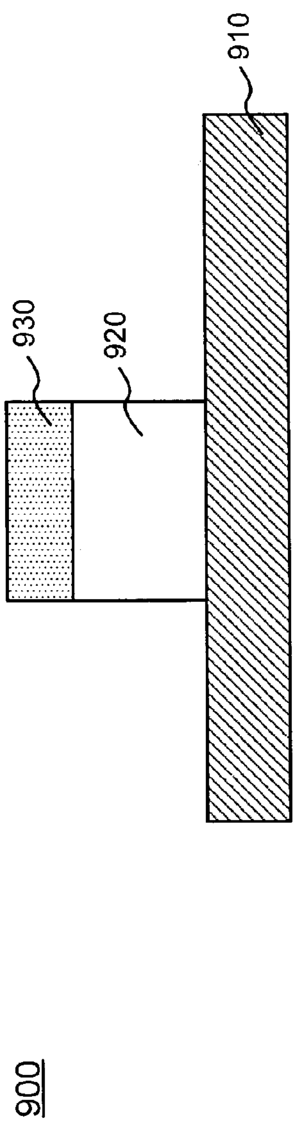
FIGS. 9A–9C are cross-sections illustrating the formation of a semiconductor device with a T-shaped gate in accordance with another embodiment of the present invention.
Figure 9B:
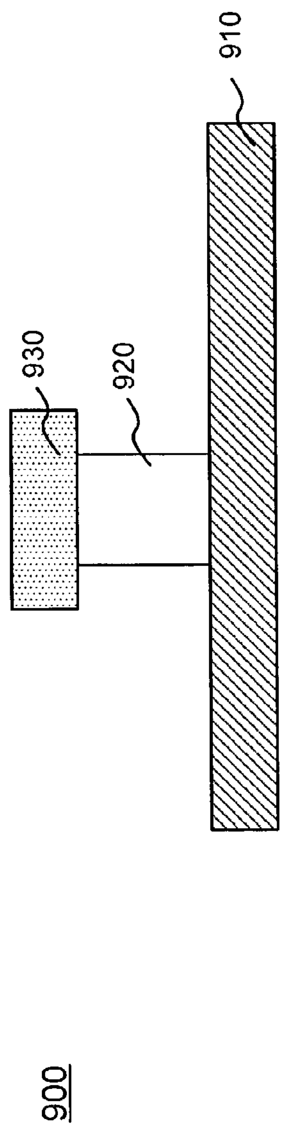
Figure 9C:
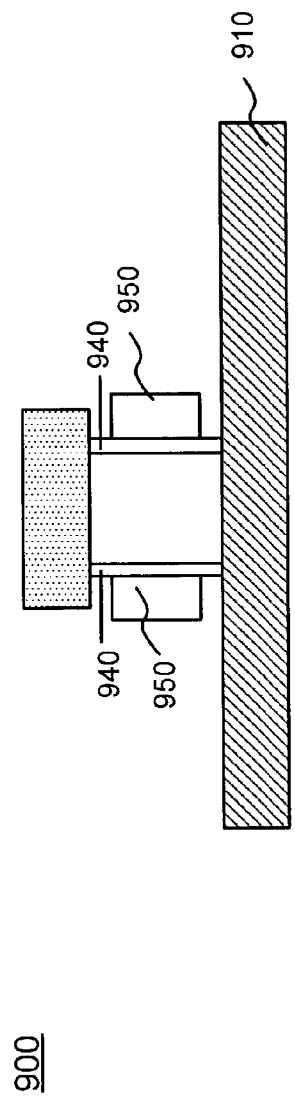
Figure 10:
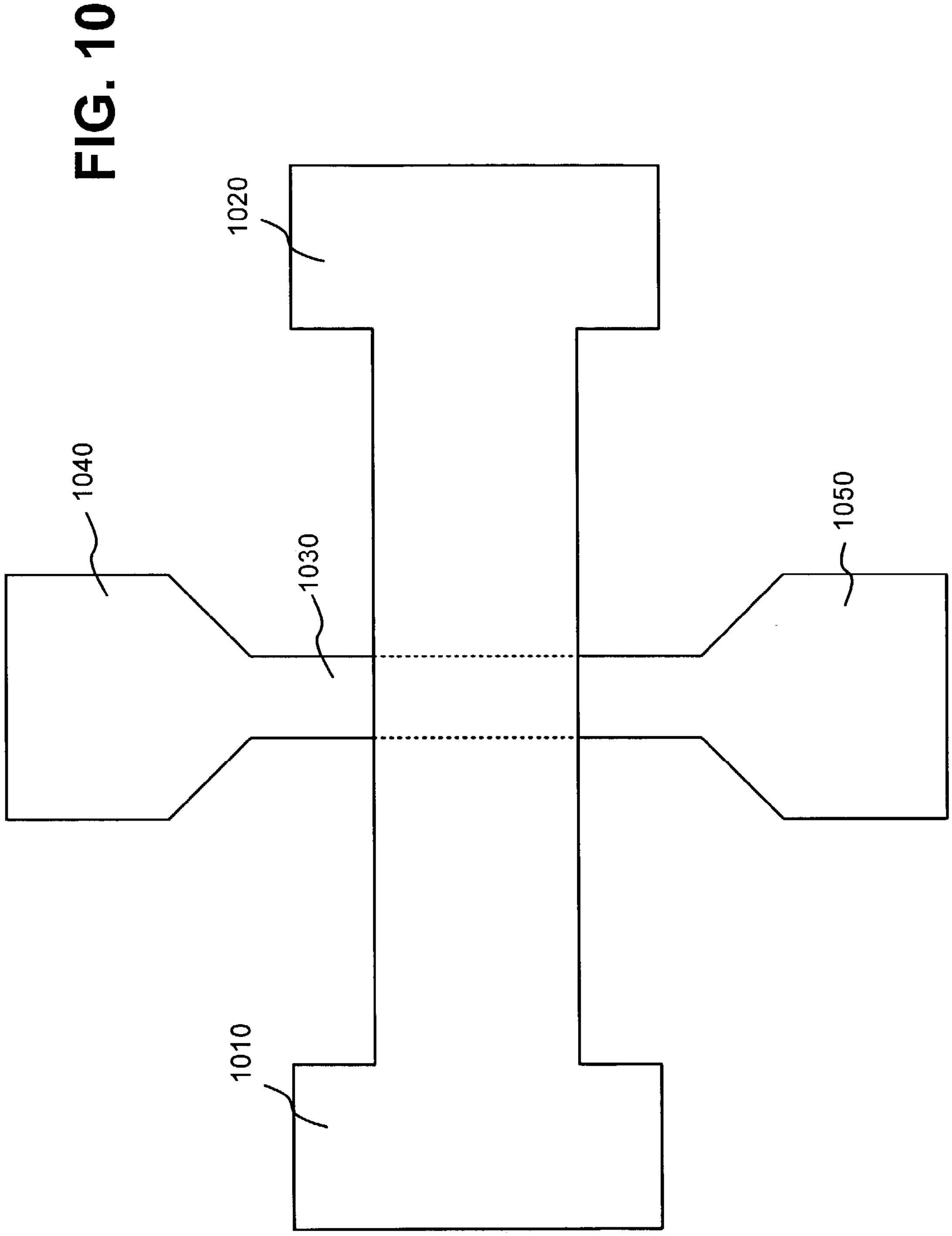
FIG. 10 is a cross-section illustrating the formation of a semiconductor device using a nitrogen-containing ambient in accordance with another embodiment of the present invention.

In another embodiment, a polysilicon fin may be trimmed to form a T-shaped gate for a memory device. For example, referring to FIG. 9A, semiconductor device 900 includes a buried oxide layer 910 formed on a substrate (not shown) with a silicon fin 920 formed thereon. A dielectric cap 930 may be formed over silicon fin 920, as illustrated in FIG. 9A. The polysilicon fin 920 may then be trimmed to form a T-shaped gate, as illustrated in FIG. 9B. The fin 920 may then be used as a floating gate electrode for a memory device. For example, a dielectric layer 940 may be formed on the side surfaces of fin 920 followed by the formation of polysilicon structures 950, as illustrated in FIG. 9C. Dielectric layer 940 may function as an inter-gate dielectric and polysilicon structures 950 may function as control gates for semiconductor device 900.

In yet another embodiment, a FinFET memory device may be formed in a similar manner as that described with respect to FIGS. 1–5. For example, semiconductor device 1000 includes control gates 1010 and 1020 formed over fin 1030 with source/drain regions 1040 and 1050 formed adjacent the ends of fin 1030. An ONO dielectric (not shown) may be formed over fin 1030 in a manner similar to ONO films 310–330 described above with respect to FIG. 3. During the formation of the oxide films in the ONO dielectric, a nitrogen ambient environment may be used. For example, an oxide film may be thermally grown on fin 1030 in an ambient environment containing $N_2O$ or NO. The oxide film may form the lower layer of the ONO inter-gate dielectric. The top oxide film in the ONO dielectric may also be formed in a nitrogen-containing environment. The source/drain regions 1040 and 1050 may also be annealed in a nitrogen-containing ambient environment. Advantageously, performing these operations in a nitrogen-containing ambient improves mobility.

Figure 11A:
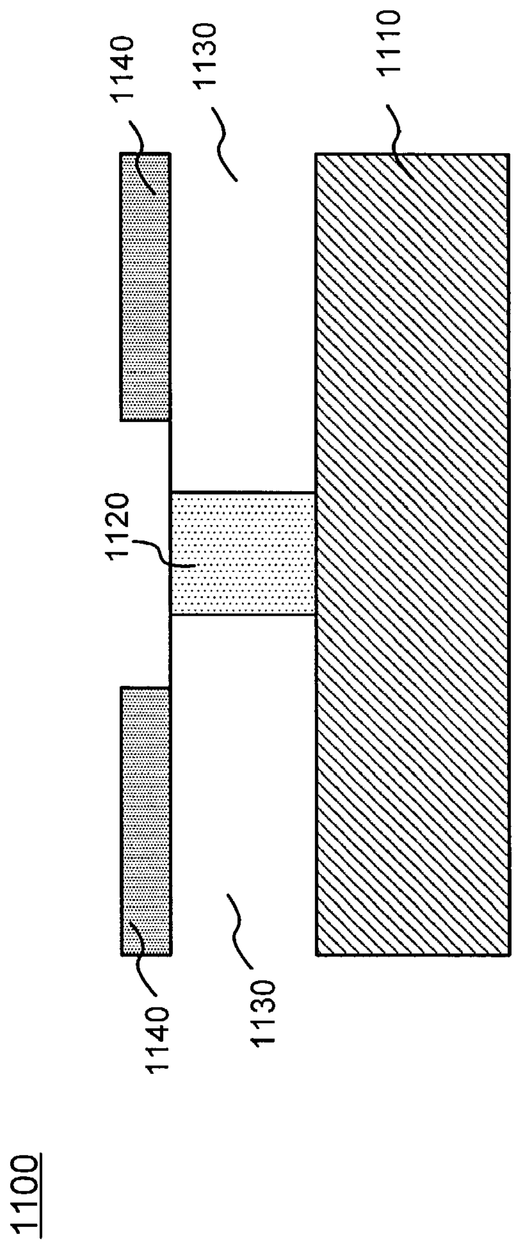
FIGS. 11A and 11B are cross-sections illustrating the formation of contact areas in accordance with another embodiment of the present invention.
Figure 11B:
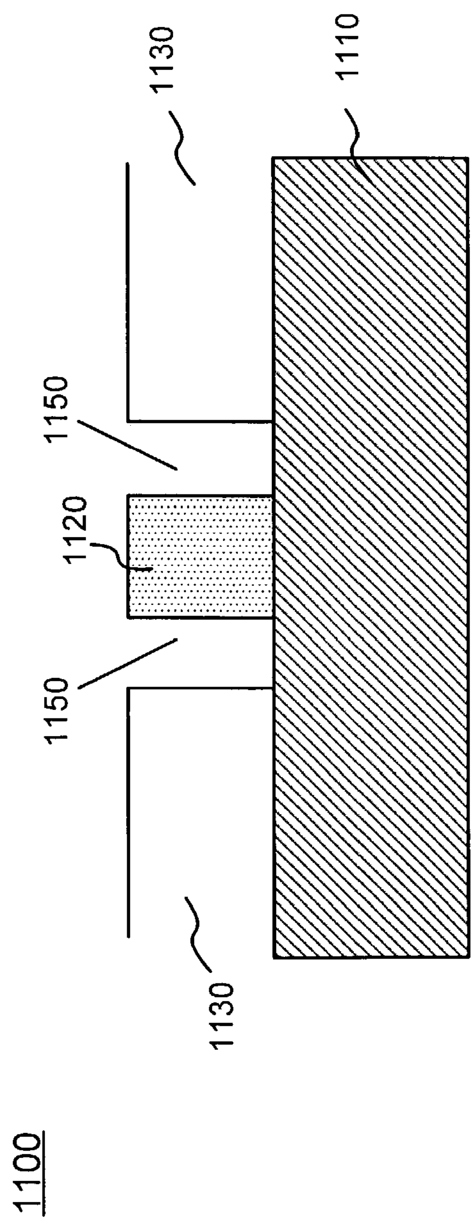

In another embodiment, a semiconductor device 1100 may include a buried oxide layer 1110 formed on a substrate (not shown) with a silicon fin 1120 formed thereon, as illustrated in FIG. 11A. A dielectric layer 1130 may be formed adjacent silicon fin 1120 and masks 1140 may be formed over portions of dielectric layer 1130, as illustrated in FIG. 11A. The masks 1140 may cover non-contact areas of semiconductor device 1100. The portions of dielectric layer 1130 not covered by masks 1140 may then be etched to form contact areas 1150 adjacent fin 1120, as illustrated in FIG. 11B. The masks 1140 may then be removed and contact areas 1150 may be filled with a conductive material to provide a contact to fin 1120. In this manner, masks may be used to define the contact area for semiconductor device 1100.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of FinFET semiconductor devices and particularly in FinFET devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail. In addition, while a series of processes for forming the semiconductor device of FIG. 5 has been described, it should be understood that the order of the process steps may be varied in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

What is claimed is:

1. A memory device, comprising:

a substrate;

an insulating layer formed on the substrate;

a fin structure formed on the insulating layer;

a first oxide layer formed on the fin structure and the substrate;

a nitride layer formed on the first oxide layer, the nitride layer not contacting the insulating layer and acting as a floating gate electrode;

a second oxide layer formed on the nitride layer; and a control gate formed over the second oxide layer.

2. The memory device of claim 1, further comprising:

a source region formed on the insulating layer and disposed adjacent a first end of the fin structure; and a drain region formed on the insulating layer and disposed adjacent a second end of the fin structure.

3. The memory device of claim 1, wherein the first oxide layer has a thickness ranging from about 110 Å to about 150 Å, the nitride layer has a thickness ranging from about 10 Å to about 180 Å and the second oxide layer has a thickness ranging from about 15 Å to about 200 Å.

4. The memory device of claim 1, wherein the first oxide layer, the nitride layer and the second oxide layer have a combined thickness ranging from about 40 Å to about 530 Å and functions as a charge storage dielectric.

5. The memory device of claim 1, wherein the control gate comprises polysilicon and has a thickness ranging about 300 Å to about 4000 Å.

6. The memory device of claim 1, wherein the insulating layer comprises a buried oxide layer and the fin structure comprises at least one of silicon and germanium.

7. The memory device of claim 6, wherein the fin structure has a width ranging from about 100 Å to about 3000 Å.

8. A non-volatile memory device, comprising:

a substrate;

an insulating layer formed on the substrate;

a conductive fin formed on the insulating layer;

a first oxide layer formed over the conductive fin;

a nitride layer formed over the first oxide layer, the nitride layer not contacting the insulating layer;

a second oxide layer formed over the nitride layer, wherein the first oxide layer, the nitride layer and the second oxide layer function as a charge storage structure for the non-volatile memory device; and a gate formed over the second oxide layer, wherein the gate acts as a control gate for the non-volatile memory device.

9. The non-volatile memory device of claim 8, further comprising:

a source region formed on the insulating layer adjacent a first end of the conductive fin; and a drain region formed on the insulating layer adjacent a second end of the conductive fin opposite the first end.

10. The non-volatile memory device of claim 8, wherein the first oxide layer has a thickness ranging from about 15 Å to about 150 Å, the nitride layer has a thickness ranging from about 10 Å to about 180 Å, and the second oxide layer has a thickness ranging from about 15 Å to about 200 Å, wherein the nitride layer acts as a floating gate electrode for the non-volatile memory device.

11. The non-volatile memory device of claim 8, wherein the gate comprises polysilicon having a thickness ranging from about 300 Å to about 4000 Å in the channel region of the non-volatile memory device.

12. The non-volatile memory device of claim 11, wherein the insulating layer comprises a buried oxide layer and the conductive fin comprises at least one of silicon and germanium.

13. The non-volatile memory device of claim 8, wherein the conductive fin functions as a substrate and a bit line and the gate functions as a word line.

14. A non-volatile memory array, comprising:

a substrate;

an insulating layer formed on the substrate;

a plurality of conductive fins formed on the insulating layer, the conductive fins acting as bit lines for the non-volatile memory array;

a plurality of dielectric layers formed over the plurality of fins, the plurality of dielectric layers comprising:

a first oxide layer, a nitride layer formed over the first oxide layer, the nitride layer acting as a charge storage structure for the non-volatile memory array, wherein the nitride layer does not contact the insulating layer, and a second oxide layer formed over the nitride layer; and a plurality of gates formed over the plurality of dielectric layers, the plurality of gates acting as word lines for the non-volatile memory array.

15. The non-volatile memory array of claim 14, wherein each of the plurality of conductive fins is separated from an adjacent fin by about 500 Å in the lateral direction.

* * * * *